(12) United States Patent
Mastrocola et al.

(10) Patent No.: US 6,356,132 B1
(45) Date of Patent: Mar. 12, 2002

(54) PROGRAMMABLE DELAY CELL

(75) Inventors: Angelo Rocco Mastrocola, West Lawn; Jeffrey Lee Sonntag, Allentown, both of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/495,522

(22) Filed: Jan. 31, 2000

(51) Int. Cl.[7] ............................................... H03H 11/26
(52) U.S. Cl. ..................... 327/276; 327/277; 327/299; 327/269
(58) Field of Search ................. 327/269, 270, 327/271, 276, 277, 284, 285, 298, 299, 403, 407

(56) References Cited

U.S. PATENT DOCUMENTS

| | | |
|---|---|---|
| 3,911,368 A | 10/1975 | Tarczy-Hornoch |
| 4,479,216 A | 10/1984 | Krambeck et al. |
| 4,623,805 A * | 11/1986 | Flora et al. .................. 327/269 |
| 4,626,716 A * | 12/1986 | Miki ........................... 327/271 |
| 5,079,520 A | 1/1992 | Rapeli ..................... 331/100 A |
| 5,157,277 A | 10/1992 | Tran et al. |
| 5,258,660 A | 11/1993 | Nelson et al. |
| 5,268,656 A | 12/1993 | Muscavage |
| 5,280,195 A * | 1/1994 | Goto et al. ................. 327/269 |
| 5,303,138 A | 4/1994 | Rozman |
| 5,373,535 A | 12/1994 | Ellis et al. |
| 5,434,525 A | 7/1995 | Leonowich |
| 5,467,040 A | 11/1995 | Nelson et al. |
| 5,479,129 A | 12/1995 | Fernandez et al. |
| 5,528,482 A | 6/1996 | Rozman |
| 5,610,546 A | 3/1997 | Carbou et al. |
| 5,668,484 A | 9/1997 | Nomura |
| 5,719,515 A * | 2/1998 | Danger ....................... 327/276 |
| 5,748,125 A | 5/1998 | Cederbaum et al. ........ 341/136 |
| 5,952,891 A | 9/1999 | Boudry |
| 5,977,805 A * | 11/1999 | Vergnes et al. ............. 327/107 |
| 5,994,939 A | 11/1999 | Johnson et al. |
| 6,025,745 A * | 2/2000 | Lee et al. ................... 327/277 |

* cited by examiner

Primary Examiner—Timothy P. Callahan
Assistant Examiner—An T. Luu
(74) Attorney, Agent, or Firm—Duane, Morris & Heckscher LLP

(57) ABSTRACT

An integrated circuit has a plurality of signal paths, at least one of which has a delay cell. The delay cell has an input terminal for receiving an signal from the signal path, and a plurality of delay paths for generating a corresponding plurality of delayed signals delayed by different delays from the input signal. At least one of the delay paths employs two different-delay subpaths coupled in parallel to provide a delayed signal delayed by an interpolated delay. A multiplexer (MUX) of the delay cell provides one of the delayed signals as an output signal to the signal path based on a control input signal applied to the multiplexer.

6 Claims, 3 Drawing Sheets

200

300

400

450

PROGRAMMABLE DELAY CELL

BACKGROUND OF THE INVENTION

1. Field of the Invention

The present invention relates to signal paths and, in particular, to the use of delay cells to achieve desired delays in clock and/or data signal paths.

2. Description of the Related Art

Circuits such as integrated circuits (ICs) typically contain signal paths for providing a given signal, such as a digital signal, from a particular signal source to a particular signal sink. For example, digital ICs typically provide both data signals and clock signals on data and clock signal paths, respectively (data signals may be considered to also include address, control, or any other type of non-clock signals, for purposes this application). A flip-flop, for example, of a memory array, may receive a clock signal from a clock signal source via a clock signal path of a clock tree, and may also receive data signals from a data source, such as a processor, via a data signal path. ICs are circuits typically formed in a manufacturing process on silicon wafers which provide a common substrate for the components of the ICs.

Clock signals are regularly timed periodic signals, which are often utilized for timing and other purposes in circuits or systems, such as digital circuits, which are often implemented as ICs. These clock signals are generated by clock sources or drivers either internal and/or external to the circuit. For example, a fast type of external clock source may be a crystal-based clock or a phase-locked loop (PLL) clock. An internal clock may be a slower, crystal-based clock or a ring oscillator. A clock signal is typically a square wave, i.e., a signal which is virtually always at either a logic "0" or low value (e.g., 0V or $V_{SS}$) or a logic "1" or high value (e.g., 3.0V or $V_{DD}$), with sharply defined edges at transition times. A clock signal thus contains a series of rising (positive) and falling (negative) edges, when the clock signal transitions from low to high and vice-versa. Data signals, while not typically periodic square waves, have similar characteristics, in that the data bits transition from logic 0 to logic 1 and vice-versa.

ICs typically include a clock network for providing a clock signal to various synchronized circuitry. The clock network typically includes one or more clock sources that are coupled to one or more clock "sinks." A clock sink is any circuit or other system element requiring a clock. Examples of clock sinks include flip-flops, Latches, registers, and gates. A clock signal may be used to trigger such elements in digital circuits. For example, storing data into a register might be triggered by the rising edge of the clock signal, i.e., the transition from low to high (a rising edge). Many digital circuits (clock sinks) are "edge-triggered," i.e., triggered by either the rising or falling edges of the clock signal.

The timing of clock and data signals in ICs is often critical and needs to be precisely controlled. Thus, the delay faced by a given data or clock signal over its respective signal path, from the signal source to the signal sink, needs to be taken into account. For example, the path length, resistance, number and type of drivers, parasitic capacitance, and other characteristics of a given signal path affect the delay between source and sink via the path.

For example, to write data to a flip-flop, it is typically desirable that data signal transitions arriving at the data input terminal of the flip-flop (data sink) arrive outside the time window between the set-up and hold time—i.e., the data transitions at the flip-flop occur after the hold time after the clock edge triggers, and before the set-up time before the next clock transition. Therefore, the IC designer tries to ensure that clock and data signal path relative delays are such that clock signals are properly aligned with respect to corresponding data signals.

Also, with regard to clock signals themselves, for example, it is typically desired that clocks routed within the IC be synchronized, such that each clock sink receives the same clock signal at approximately the same time. If clock signals arrive at various clock sinks at different times, this results in "clock skew" at the clock sinks, which can impair synchronization. Thus, in many synchronous digital circuits, the clock edges of the clocks for various circuit regions are aligned to occur, ideally, at the same time throughout the system. The IC designer attempts to achieve this by ensuring that the various clock paths of a given clock network or clock tree have the same signal delay.

A clock tree distributes an input clock signal from a given source to various clock sinks in the system, by a network of clock drivers and clock signal paths from the clock source to the clock sinks to be driven by the clock signal. Thus, for example, a given clock tree may have three branches for distributing a clock signal provided by a single clock source to three (or more) different clock sinks. Each branch is designed so that each clock signal propagating therethrough is delayed by the same amount from the common point of the branches (e.g., the clock source) to the various clock sinks.

It can be difficult to precisely determine, at the design stage, the delay of various signal paths in the IC, due to the complex factors that influence the signal delay. Often an IC will be fabricated, and testing determines that the delays of one or more paths are too long or too short. For example, if the delay of a clock path for a flip-flop is longer than expected from the IC design and layout, the data signal may transition too early, before the hold is completed. In such a case it would be desirable to increase the relative delay of the data signal path (or, what is the same thing, to decrease the relative delay of the clock signal path).

Conventional responses to this problem include redesigning the IC or its layout. For example, signal path routing may be changed, in an attempt to adjust the delays to within acceptable limits. However, this can be expensive and time-consuming. Alternatively, instead of redesigning the entire layout, only the metal masks are changed to re-route wires. This latter approach is typically less costly than the former approach, but can still be prohibitively or undesirably expensive and time-consuming.

SUMMARY

In the present invention, an integrated circuit has a plurality of signal paths, at least one of which has a delay cell. The delay cell has an input terminal for receiving an signal from the signal path, and a plurality of delay paths for generating a corresponding plurality of delayed signals delayed by different delays from the input signal. At least one of the delay paths employs two different-delay subpaths coupled in parallel to provide a delayed signal delayed by an interpolated delay. A multiplexer (MUX) of the delay cell provides one of the delayed signals as an output signal to the signal path based on a control input signal applied to the multiplexer.

DESCRIPTION OF THE PREFERRED EMBODIMENT

The present invention provides a programmable delay cell that can be placed in series in one or more signal paths of an IC. This can be used to help adjust delays to achieve better results in already-fabricated ICs, or for purposes such as debugging, characterization, yield enhancement, and the like.

Figure 1:
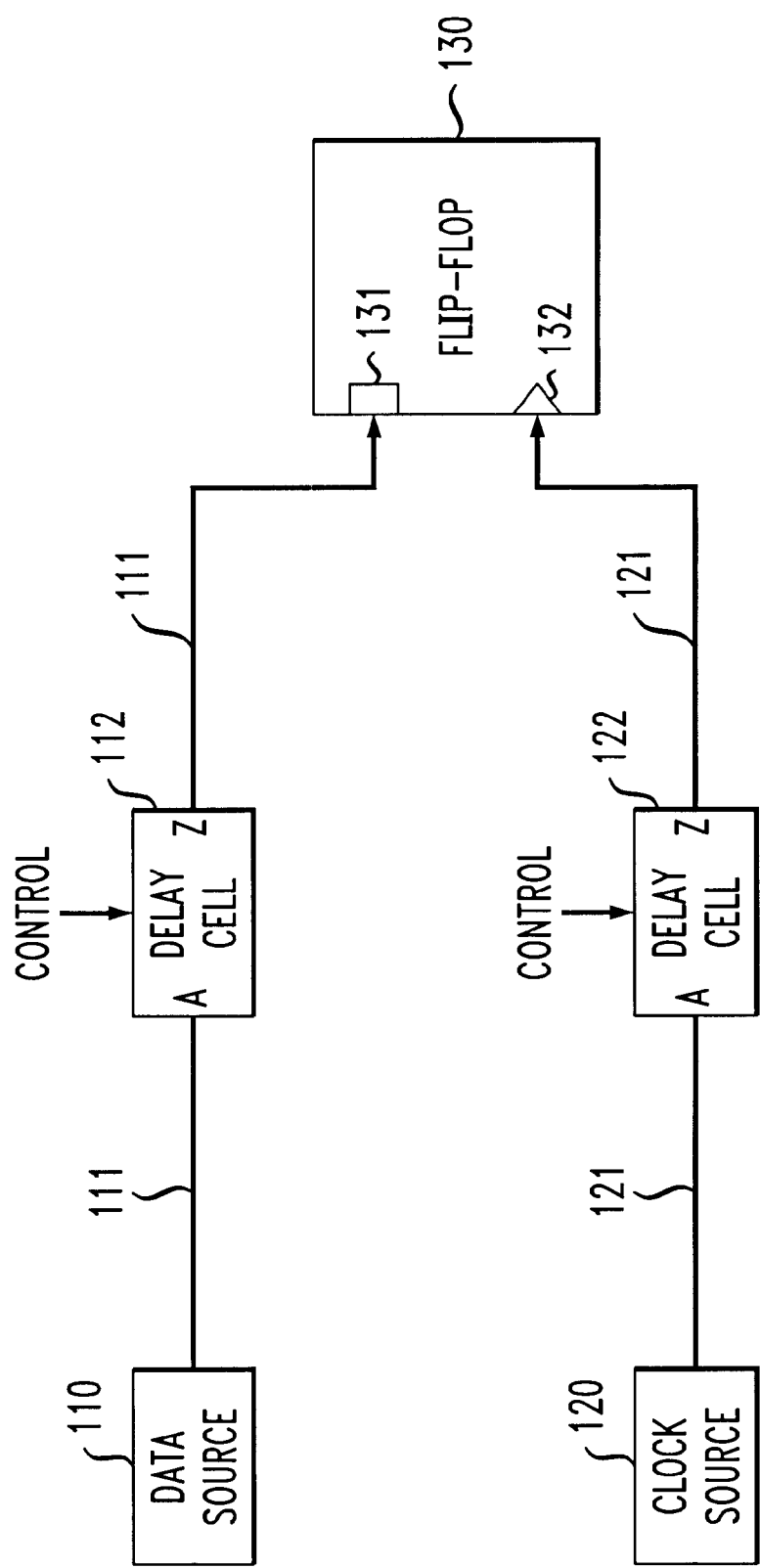
FIG. 1 is a block diagram of a portion of an IC having exemplary clock and data signal paths and programmable delay cells of the present invention.

Referring now to FIG. 1, there is shown a block diagram of a portion of an IC 100 having exemplary clock and data signal paths 111, 121 and programmable delay cells 112, 122 of the present invention. Each delay cell 112, 122, has an input terminal A and an output terminal Z. In an embodiment, both clock and data signal paths which are related in some manner have delay cells, so that the relative delay between these related paths may be adjusted. In this case, the paths are considered to be related or associated because data signal path 111 carries data signals from data source 110 to data input terminal 131 of flip-flop 130, and clock signal path 121 carries clock signals from clock source 120 to clock input terminal 132 of flip-flop 130. Data source 110 may be, for instance, a processor. Clock source 120 may be, for example, a PLL clock.

The signal paths have inserted in-line delay cells 112, 122, respectively, which delay the signals received at the respective delay cell's input terminal A by a specified amount, depending on the control signal received and the default delay of the delay cell, to provide a delayed signal on the respective delay cell's output terminal Z.

Thus, for example, if a data signal of data path 111 would normally have a fixed delay of $D_{D1}$, without the presence of delay cell 112, then with delay cell 112 present, the total delay $D_D = D_{D1} + D_{DC}$, where $D_{DC}$ is the programmable delay introduced by delay cell 112. The total delay of clock signal path 121 is controllable by programmable delay cell 122 in a similar manner. The delay $D_{DC}$ of each of delay cells 112, 122, depends on the control signal applied to each delay cell. The control signal controlling the delay of a given delay cell is typically a multi-bit signal. For example, if delay cell 112 has four possible delay settings, the control signal may be a two-bit or a four-bit control signal to select one of the four delay settings. Each delay cell 112, 122, receives a respective control signal. These control signals may be provided by a processor or control logic, as will be appreciated. In the absence of any control signal, each delay cell provides a default delay.

In a preferred embodiment, each delay cell provides one of four delays, each approximately one gate delay G apart. A gate delay G is the delay that arises when a signal passes through a device such as an inverter. The delay cell may have a fixed delay component (e.g., due to the output MUX), and a selectable or programmable portion. The programmable portion may include the following selectable delays: 1G, 2G, 3G, or 4G, depending on the state of the control lines applied to the delay cell. Thus, the delay $D_{DC}$ of a given delay cell is equal to the selected delay portion plus the fixed delay.

Each delay cell 112, 122 preferably is controlled by four control lines, each of which uniquely selects one of the four possible delays $D_{DC}$. Thus, in one embodiment, each delay cell provides a programmable delay of 1G, 2G, 3G, or 4G. The higher delays 2G, 3G, and 4G are integer multiples of the minimum programmable delay. The programmable delay of the delay cell is added to any other fixed delays caused by components of the delay cell.

As will be appreciated, given such a programmable delay cell, implemented in various signal paths of an IC 100, the delay cells may be used in a variety of ways to improve the performance of an IC or its design. For example, suppose IC 100 is fabricated and the delay of data signal path 111 is about 2G too small, relative to clock signals from clock source 120. I.e., the data signals arrive too early at flip-flop 130, even given a default gate delay of 1G already provided by delay cell 112. In this case, the appropriate control signal may be transmitted to delay cell 112, e.g. by a CPU or control logic, to cause delay cell 112 to implement a programmable delay of 3G, i.e. 2G more than currently provided. This can permit the relative delay of clock and data signals to be adjusted to the desired relative delay, to improve performance of circuits or systems of IC 100 employing signal paths 111, 112, and flip-flop 130.

Alternatively, a test batch of ICs identical to IC 100 may be produced. If flip-flop 103 or associated circuity does not function properly, the delays of delay cells 112, 122 can be adjusted to try different delay values, to try to determine what is the proper relative delay for data and clock signal paths 111, 112. It may be discovered, for example, that when delay cell 112 implements a programmable delay of 3G and delay cell 122 implements a programmable delay of 1G, the circuit functions properly. At this point, the circuit may be used after configuring the delay cells to provide these delays; or, the circuit may be redesigned to avoid the problem. For instance, the layout and/or IC design may be modified slightly to add two gate delays 2G to path 111, so that the default programmable 1G delay of delay cell 112 is sufficient. Alternatively, delay cell 112 may be modified in the IC design so that it provides a default programmable delay of 3G, adjustable, for example, to 4G, 5G, or 6G with the application of different control signals.

Accordingly, having a programmable delay cell such 112, 122 which can provide a number of delays spaced about one gate delay apart can be very useful in the use, design, adjusting, and debugging of ICs.

Figure 2:
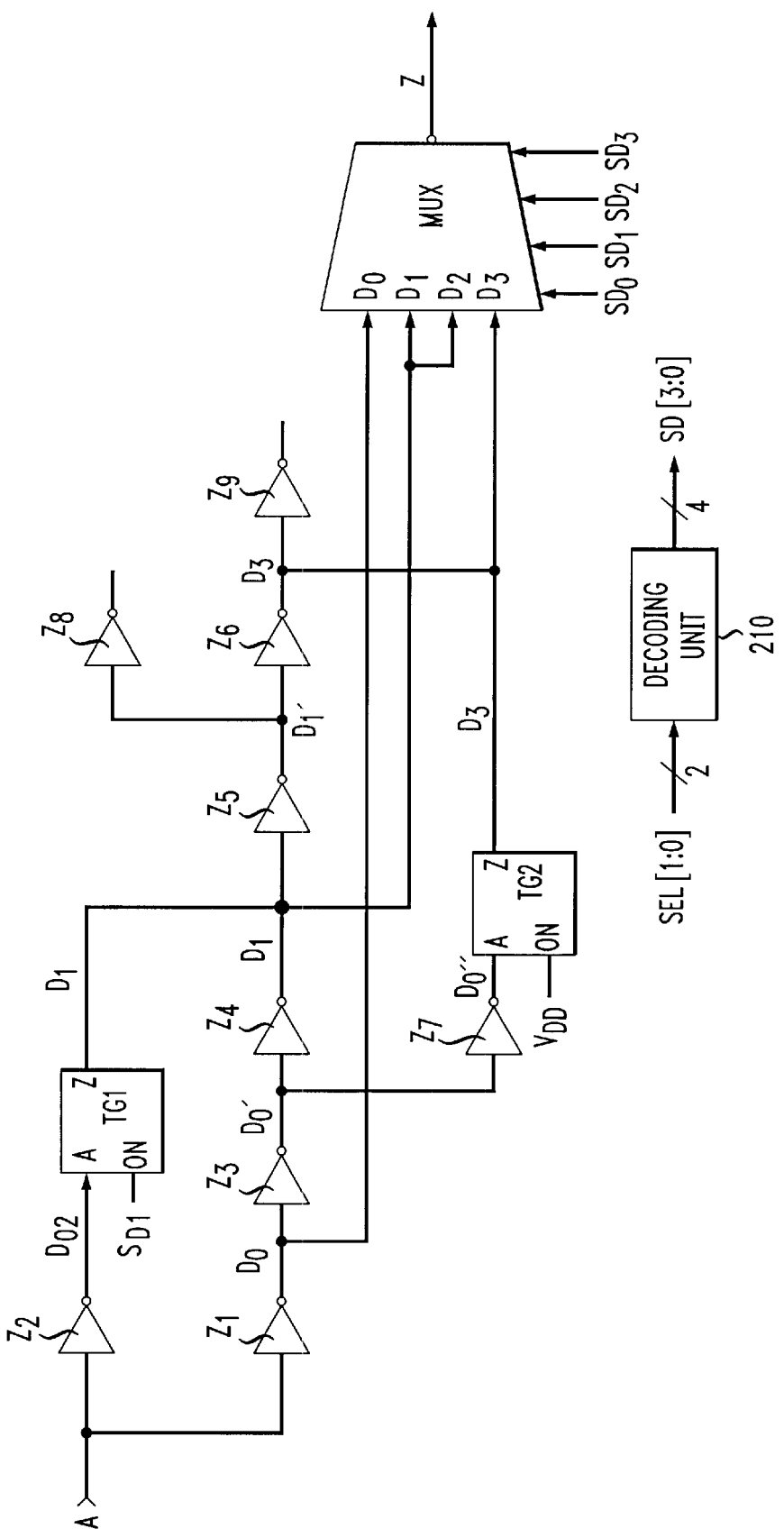
FIG. 2 is a block diagram illustrating a programmable delay cell in further detail, in accordance with an embodiment of the present invention.

Referring now to FIG. 2, there is shown a block diagram illustrating a programmable delay cell 200 in further detail, in accordance with an embodiment of the present invention. As will be appreciated, a delay cell such as delay cell 200 may be used to provide delay cells 112, 122 of IC 100 of FIG. 1. Delay cell 200 is programmable, and also provides a default delay $D_{DC}$. Delay cell 200 also provides a relatively simple circuit architecture, to provide single gate delay incremental delays between delay settings, all without inverting the input signal. Delay cell 200 also provides a small initial latency.

Delay cell 200 receives an input signal A at its input terminal, and provides an output signal Z at its output terminal. The output signal may be essentially identical to the input signal, but time-delayed by the delay $D_{DC}$ of the delay cell. Also, it should be noted that the output signal Z is not inverted with respect to the input signal A. When used, for example, in data signal path 111 of IC 100, the input signal is the data signal received from data source 110, already delayed by part of the delay $D_{D1}$ of the data signal path 111. Output signal Z, which is delayed by delay $D_{DC}$ with respect to input signal A, is further delayed by the remainder of the delay $D_{D1}$ of the data signal path 111, and received as a data signal by flip-flop 130. The data signal received by flip-flop 130 thus has a total delay $D_D=D_{D1}+D_{DC}$, with respect to data source 110.

In an embodiment, delay cell 200 employs a 4:1 multiplexer MUX with select inputs SD[0:3], various inverters $Z_1$–$Z_9$, and two transmission gates TG1, TG2, which preferably employ the same size transistors as the inverters of delay cell 200. As illustrated, the MUX, in an embodiment, employs four independent control signals, one for each of the four possible inputs $D_{0-3}$ selected as the output Z for the MUX. In an alternative embodiment, a two-bit control port having inputs SEL[1:0] could be used to select any of the four possible states of the MUX. For example, the two-bit control signal SEL[1:0] could be run to a decoding unit 210 may be used to output the four signals SD[3:0], given the two-bit input signal SEL[1:0]. Alternatively, the MUX itself may be driven by a two-bit input signal SEL[1:0].

The MUX provides an output signal Z which is one of four delayed versions of input signal A, to-wit: control or select signal SD0 selects signal D0, which is delayed by one gate delay from input signal A; control signal SD1 selects signal D1, which is interpolated such that it is delayed by two gate delays from input signal A; control signal SD2 selects signal D1 (non-interpolated) which is delayed by three gate delays from input signal A; and control signal SD3 selects signal D3 (interpolated), which is delayed by four gate delays from input signal A.

Four delay paths are employed which add a selected amount of delay to input signal A, to provide the four delayed inputs to the inputs of the MUX. The MUX also adds its own, nominally fixed, delay. The first delay path contains inverter Z1, which provides a single gate delayed version of signal A, signal D0, to corresponding input D0 of the MUX. The MUX is an inverting multiplexer, so that output signal Z at this point is a non-inverted version of input signal A, delayed by about 1G from input signal A (plus the delay of the MUX). In an alternative embodiment, a non-inverting MUX may be employed.

The transmission gates TG1 and TG2 are employed in two of the delay paths, respectively. If a single extra inverter were placed in-line following signal D0, the resulting signal would be delayed by one additional gate delay, but would be inverted. If two inverters are used instead so that the next delayed signal were not inverted, it would differ by two gate delays from D0. Therefore, the delay path for signal D1, which is to differ by about one gate delay from D0, contains two delay subpaths in parallel, one having virtually no gate delay from D0, and one having about a 2G gate delay from D0, to provide a signal D1 with an interpolated gate delay of approximately 1G beyond that of delayed signal D0, i.e. 2G beyond that of input signal A. As used herein, two subpaths are considered to be in parallel when the input nodes of the subpaths are coupled together and the output nodes of the subpaths are coupled together, even if the subpaths share some elements between the common input and output nodes.

In particular, signal A passes through inverter Z2 to provide dummy 1G delayed signal D02. When SD1 is selected, TG1 is also on, because SD1 is coupled to the ON input of TG1, and TG1 transmits this signal to its output at node D1. Inverter Z2 and TG1 thus form one delay subpath for delayed signal D1. This signal wants to have virtually no delay with respect to signals D0 and D02. However, the output of TG1 is coupled to the output of inverter Z4, which wants to have a delay of about 2G with respect to signals D0 and D02. Thus, these two subpaths are interpolated and produce an output between the two outputs that the subpaths would provide if not coupled in parallel, to provide a delay about 1G beyond that of signal D0, i.e. a delay of about 2G from input signal A. Thus, the delay path for the 2G signal D1 comprises a first subpath containing inverters Z1, Z3, Z4, for providing a 3G delayed signal, and a second subpath containing inverter Z2 and TG1, for producing a 1G delayed signal, which are in parallel and are interpolated to produce a delay signal D1 having a delay of 2G from input signal A.

When SD2 selects input D2, SD1 is no longer on and thus TG1 is no longer on. Thus, at this point, the output of inverter Z4, with a delay of 3G, which is tied also to the input D2 of the MUX, does not fight the output of TG1 and thus provides a signal D1 having a delay of about 3G to input terminal D2 of the MUX. Thus, the delay path for the 3G signal D1 comprises inverters Z1, Z3, Z4, for providing a 3G delayed signal, and does not include the second subpath containing inverter Z2 and TG1, since TG1 is off when SD2 is on and SD1 is off.

To provide 4G delayed signal D3, interpolation is again used because otherwise, signal D3 would be inverted or would differ from D2 by 2G instead of 1G. Thus, 2G delayed signal D0' is applied to inverter Z7 and passed by TG2, which is always on due to $V_{DD}$ being applied to its ON input. Alternatively, a logic signal may be applied to the ON input of TG2 to always turn on TG2 whenever power is applied to IC 100. This first delay subpath (comprising inverters Z1, Z3, Z7, and TG2) provides an output at D3 which wants to be delayed by about 2G from first delayed signal D0. A second delay subpath comprising inverters Z1, Z3, Z4, Z5, and Z6 provides an output at D3 which wants to be delayed by about 4G from delayed signal D0. Because these delay subpaths are in parallel, they fight each other to provide signal D3 which has an interpolated delay of about 3G from delayed signal D0. In an alternative embodiment, to save power, instead of running $V_{DD}$ to the ON input of transmission gate TG2, it may be configured to be turned off except when SD3=1 by running to its ON input signal SD3. As will be appreciated, power is saved in such an embodiment, because the two subpaths do not consume the additional power involved in interpolation unless SD3 is asserted.

Inverters Z2, Z1 are employed to buffer the input so that input capacitance does not change with delay setting. However, use of these inverters means that even the lowest delay setting SD0, which selects signal D0, has a delay of at least 1G. Inverter Z2 is used instead of simply coupling signal D0 to the input A of TG1, to avoid an undesirable bistable latch that would otherwise result from TG1, Z3, and Z4. Similarly, inverter Z7 is employed instead of simply connecting the output of inverter Z4 to input A of TG2, to avoid creating a bistable latch. Inverters Z8 and Z9 are employed as dummy inverters to equalize loading capacitances on strategic nodes of delay cell 200.

Thus, in the present invention, separate delay paths are employed to produce a plurality of delayed signals based on an input signal, and a MUX is used to select one of these delayed signals. In the preferred embodiment illustrated in FIG. 2, two of the delay paths employ parallel subpath interpolation, so that the four MUX settings select outputs that are spaced apart from each other by about one inverter gate delay G. The MUX is preferably designed so that it selects one of the four inputs as a default whenever no select signals SD[0:3] are applied to the MUX. For example, the MUX may always select signal D0 unless one of signals SD1, SD2, SD3 is on. Alternatively, another such delayed input signal may be selected as the default input signal.

Figure 3:
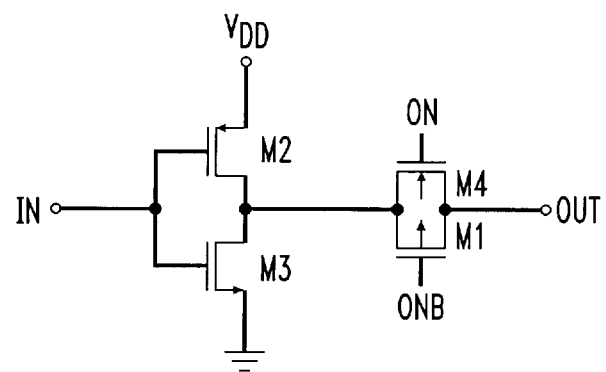
FIG. 3 is a circuit diagram of an embodiment of an inverter/transmission gate circuit of the programmable delay cell of FIG. 2.

Referring now to FIG. 3, there is shown a circuit diagram of an embodiment of an inverter/transmission gate circuit 300 of programmable delay cell 200. Inverter/transmission gate circuit 300 may be used to provide the inverter $Z_1$ and transmission gate TG1 functionality, for example, or that of inverter $Z_7$ and transmission gate TG2. Inverter/transmission gate circuit 300 comprises p-channel transistor M2 and n-channel transistor M3, intercoupled as shown to form an inverter, the output of which is coupled to n-channel transistor M4 and p-channel transistor M1, which are coupled to provide a transmission gate. The output OUT of the transmission gate is an inverted and delayed version of the input signal IN, whenever the control signal ON is asserted (and its complement, ONB, is opposite). When the control signal ON is not asserted, the transmission gate is off and the output OUT is tristated.

Figure 4A:
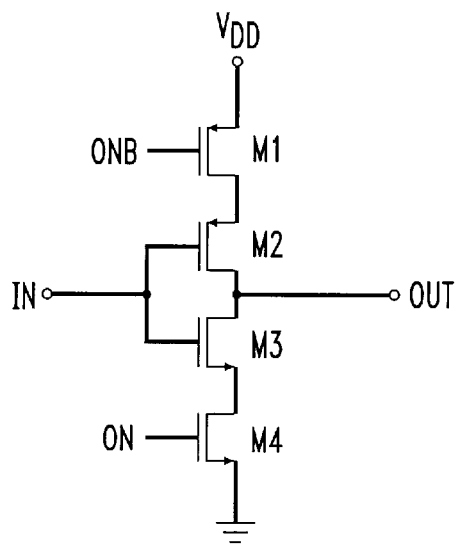
FIGS. 4A–B are circuit diagrams of alternative embodiments of a tristatable inverter circuit for use in an embodiment of the programmable delay cell of FIG. 2.
Figure 4B:
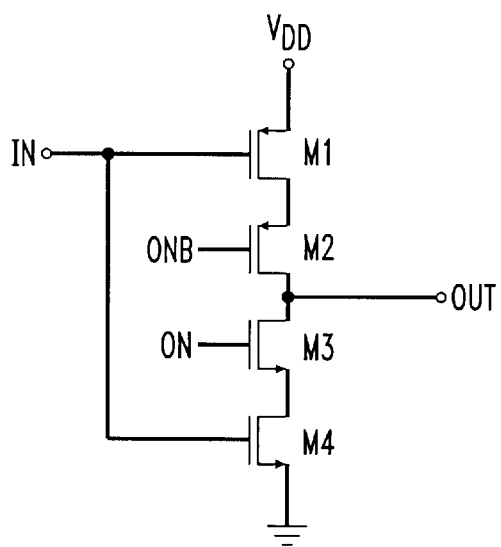

Referring now to FIGS. 4A–B, there are shown circuit diagrams of alternative embodiments 400, 450 of a tristatable inverter circuit for use in an embodiment of programmable delay cell 200 of FIG. 2. Circuit 400 comprises four transistors M1, M2, M3, and M4, intercoupled as shown. When the ON signal is all the way at the positive supply rail ($V_{DD}$) and the ONB signal is all the way at the negative supply rail ($V_{SS}$ or ground), transistors M2 and M3 function as an inverter to provide an output signal OUT which is an inverted and delayed version of the input signal IN applied to the gates of M2 and M3. When the ON signal is a logic low signal (and ONB is correspondingly a logic high), the output OUT is tristated. Thus, in this embodiment, transistors M1 and M4 perform a similar function as the transmission gate portion of circuit 300, except they are integrated into the inverter design itself, rather than following the inverter as a separate transmission-gate stage. Circuit 450 is similar to circuit 400, with the four transistors M1, M2, M3, M4 coupled at their gates in a different way to the input signal IN and to the ON and ONB signals. Circuit 450 operates similarly to circuit 400 in terms of input and output signals.

As noted above, the use of the programmable delay cell of the present invention in various signal paths of an IC, such as in related clock and data signal paths, can be used to help adjust delays to achieve better results in already-fabricated ICs, or for purposes such as debugging, characterization, yield enhancement, and the like. Delay cell 200 also provides a small initial latency, and is less costly and error prone than alternative path adjustment techniques such as rerouting wires or redesigning the photomasks and layout. Any number of delay cells may be instantiated in a given IC design; e.g., there may be one in each of a large number of signal paths, to improve adjustability and debugging. Because the delay cells may be produced in multiple instantiations as a predetermined circuit in the IC, these multiple instantiations should match each other better than random placement of alternative delay paths which has been used in the prior art. The present invention thus provides a compact, effective method to achieve outputs spaced apart by approximately single gate delays for successive input digital control settings. Moreover, even though single gate delay spacings are achieved, no inversion of output waveforms result. In addition, the fact that each delay cell's gate delays track the gate delays of other elements on the same IC can provide further advantages in some applications.

In an embodiment, the MUX may employ, internally, a transmission gate for each input signal, where each transmission gate is controlled by a respective one of the select inputs SD[0:3]. In an alternative embodiment, because inputs D1, D2 are coupled together, a single transmission gate is employed internally by the MUX for these two inputs, coupled to a combined control select signal SD12= SD1+SD2. This combined control select may be provided by an internal OR gate, for example.

In an alternative embodiment, a number of delayed signal other than four may be generated and selectable through a MUX, such as two. Further, in an alternative embodiment, adjacent delayed signals may differ from each other by a delay greater or smaller than 1G. For example, four delay paths each containing an even number of inverters in series may be used to provide signals delayed from each other by 2G (the first may have only a single inverter, however, to avoid an inverted signal due to the use of an inverting MUX). For instance, in such an embodiment, four delayed signals D0–D3 may be generated having delays of 1G, 3G, 5G, and 7G from the input signal A (plus the fixed delay of the MUX). However, use of larger delay increments between adjacent delay signals may be less desirable because it may provide inferior ability to adjust and control relative delays of various signal paths.

In another embodiment, the delayed output signal generated by a programmable delay cell in accordance with the present invention may be inverted with respect to the input signal. For example, the delay cell 200 of FIG. 2, if provided with a non-inverting MUX instead of an inverting MUX, would provide an inverted, delayed output signal Z.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. An integrated circuit having a plurality of signal paths, comprising at least one delay cell in at least one of said signal paths, said delay cell comprising:
    (a) an input terminal for receiving an input signal from the signal path;
    (b) a plurality of delay paths for generating a corresponding plurality of delayed signals delayed by different delays from the input signal, wherein at least one of said delay paths employs two different-delay subpaths coupled in parallel to provide a delayed signal delayed by an interpolated delay; and
    (c) a multiplexer for providing one of said delayed signals as an output signal to the signal path based on a control input signal applied to the multiplexer.

2. The integrated circuit of claim 1, wherein the plurality of signal paths comprises at least one data signal path and one clock signal path related to the data signal path, wherein at least one of said related data and clock signal paths comprise a respective delay cell for adjusting the relative delay of said signal paths.

3. The integrated circuit of claim 1, wherein the plurality of delay paths comprises four delay paths for generating four delayed signals.

4. A programmable delay cell comprising:
    (a) an input terminal for receiving an input signal;
    (a) a plurality of delay paths for generating a corresponding plurality of delayed signals delayed by different delays from the input signal, wherein at least one of said delay paths employs two different-delay subpaths coupled in parallel to provide a delayed signal delayed by an interpolated delay; and (b) a multiplexer for providing one of said delayed signals as an output signal based on a control input signal applied to the multiplexer.

5. The programmable delay cell of claim 4, wherein the plurality of delay paths comprises four delay paths for generating four delayed signals.

6. In an integrated circuit having a plurality of signal paths comprising at least one data signal path and one related clock signal path, a method for adjusting the relative signal delays of the data and clock signal paths, comprising the steps of:

(a) providing a programmable delay cell in at least one of the data and clock signal paths for adjusting the relative delay of said signal paths in response to respective control signals applied thereto, wherein each said delay cell comprises:

(1) an input terminal for receiving an input signal from its respective signal path;

(2) a plurality of delay paths for generating a corresponding plurality of delayed signals delayed by different delays from the input signal, wherein at least one of said delay paths employs two different-delay subpaths coupled in parallel to provide a delayed signal delayed by an interpolated delay; and (3) a multiplexer for providing one of said delayed signals as an output signal to said signal path based on a control input signal applied to the multiplexer;

(b) providing a control signal to at least one of said delay cells to change the delay provided by said delay cell to adjust the relative signal delays of the data and clock signal paths.

\* \* \* \* \*